United States Patent [19]

Klem et al.

[11] Patent Number: 5,679,963
[45] Date of Patent: Oct. 21, 1997

[54] SEMICONDUCTOR TUNNEL JUNCTION WITH ENHANCEMENT LAYER

[75] Inventors: John F. Klem, Sandia Park; John C. Zolper, Albuquerque, both of N. Mex.

[73] Assignee: Sandia Corporation, Albuquerque, N. Mex.

[21] Appl. No.: 567,678

[22] Filed: Dec. 5, 1995

[51] Int. Cl.$^6$ .................. H01L 29/40; H01L 33/00; H01L 31/0328
[52] U.S. Cl. .................. 257/46; 257/94; 257/184
[58] Field of Search .................. 257/184, 46, 94, 257/96, 97, 183; 136/249, 252

[56] References Cited

U.S. PATENT DOCUMENTS

| | | | |
|---|---|---|---|
| 4,255,211 | 3/1981 | Fraas | 136/249 |
| 4,451,691 | 5/1984 | Fraas | 136/249 |
| 5,019,177 | 5/1991 | Wanlass | 257/94 |
| 5,166,761 | 11/1992 | Olson et al. | 257/46 |

OTHER PUBLICATIONS

Miller et al; Journal of Applied Physics, "GaAs–AlGaAs Tunnel Jinchin for Multigap Cascade Solar Cell"; vol. 53 pp. 74–748, 1982 no month.
Olson, et. al., *Applied Physics Lett.* 56 (7), A 27.3% Efficient $Ga_{0.5}In_{0.5}P$/GaAs Tandem Solar Cell, 12 Feb. 1990, pp. 623–625.
J. Klem et al., *J. Cryst. Growth*, Growth and Properties of Ga As Sb/In Ga As superlattices on InP, Vo. 11, 1991, pp. 628–632 no month.
M. Wanlass et al., *Monolithic, Series–Connected InP/$Ga_{0.47}In_{.53}$ As Tandem Solar Cells*, 1993, pp. 621–626 no month.
D. Jung et al., *Journal of Applied Physics*, AlGaAs/GaInP Heterojunction Tunnel Diode for Cascade Solar Cell Application, V. 74, 1993, pp. 2090–2093 no month.
K. Zahraman et al., *Twenty Third IEEE Photovoltaic Specialist Conference*, 1993, pp. 708–711 no month.
A. R. Sugg, et al., *Appl. Phys. Lett*, May 1993, pp. 2510–2512.
H. Sakaki, et al., *Appl. Phys. Lett*, Aug. 1977, pp. 211–213.
M. J. Martinez, et al., *4th International Conf. on InP & Related Materials*, 1992, IEEE, pp. 354–356 no month.

*Primary Examiner*—Wael Fahmy
*Attorney, Agent, or Firm*—George H. Libman

[57] ABSTRACT

The incorporation of a pseudomorphic GaAsSb layer in a tunnel diode structure affords a new degree of freedom in designing tunnel junctions for p-n junction device interconnects. Previously only doping levels could be varied to control the tunneling properties. This invention uses the valence band alignment band of the GaAsSb with respect to the surrounding materials to greatly relax the doping requirements for tunneling.

14 Claims, 2 Drawing Sheets

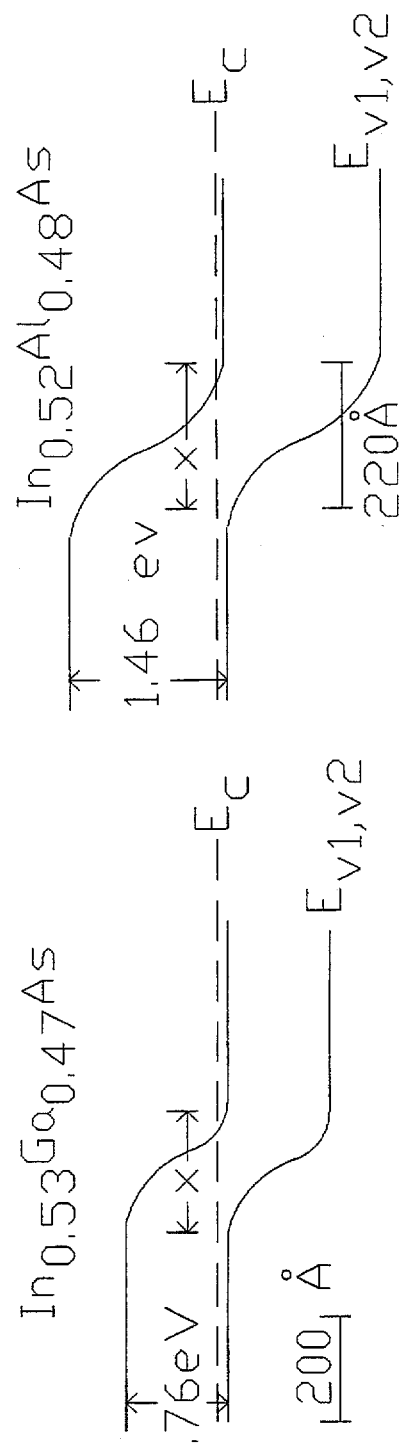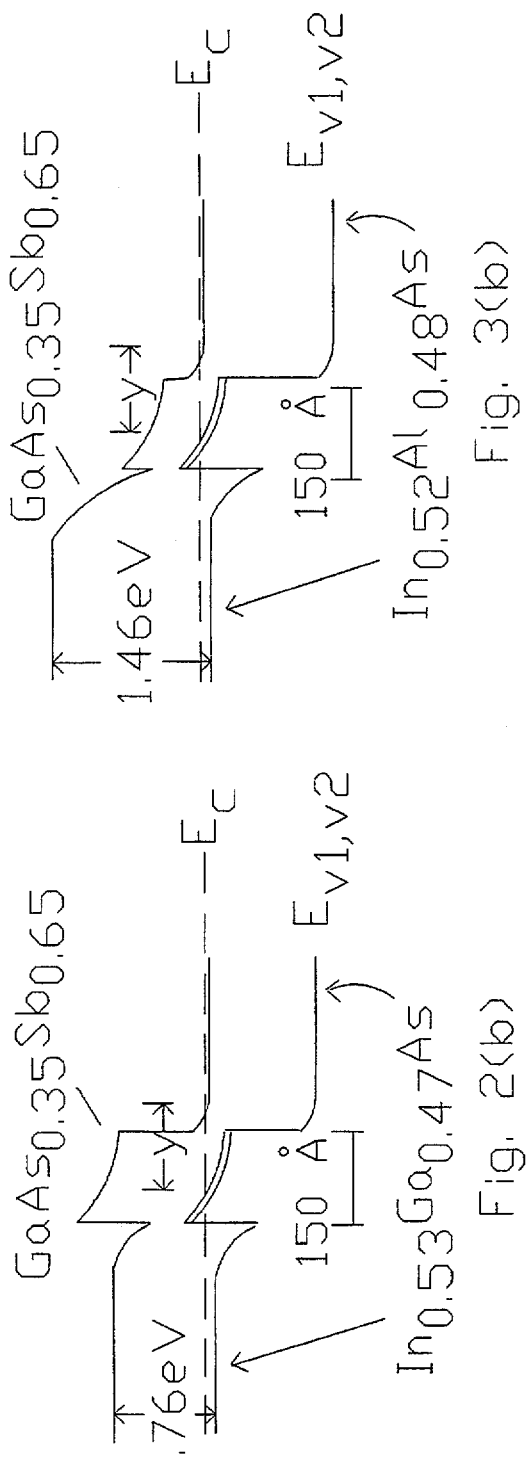

SEMICONDUCTOR TUNNEL JUNCTION WITH ENHANCEMENT LAYER

The United States Government has rights in this invention pursuant to Department of Energy Contract No. DE-AC04-94AL85000 with Sandia Corporation.

BACKGROUND OF THE INVENTION

Multijunction photovoltaic solar cells have been recognized for their potential of achieving high conversion efficiencies. One promising structure is the monolithic, two-terminal tandem solar cell. Such a design has reduced processing costs when compared with other, more complicated, designs. However, it has an inherent problem in the intercell interconnect that must be overcome before the full value of the design is realized.

In such a device, a photovoltaic cell is deposited on a substrate, and then another cell is deposited on the first cell. Each cell is designed to absorb a different wavelength of light; ideally, energy for the bottom cell passes through the first with minimal loss.

Each of the cells is doped to form one of a p-n or n-p diode. Accordingly, the intersection of this series p-n, p-n structure, or n-p, n-p structure, is an opposing n-p or p-n diode which tends to limit the electrical efficiency of the device. For this reason, these tandem cells are often manufactured with a tunnel diode or junction between the cells. The tunnel diode is a p-n device which exhibits nearly linear current-voltage characteristics near zero volts bias. The tunnel diode provides ohmic contact between tandem solar cells. This approach has been demonstrated in tandem solar cells made of AlGaAs/GaAs (D. Miller et al., *Journal of Applied Physics*, V. 53, pp. 744–748, 1982), AlGaAs/GaInP (i). Jung et al., *Journal of Applied Physics*, V. 74, pp. 2090–2093, 1993), GaInP/GaAs (J. Olson et al., *Appl. Phys. Lett.* 56(7), 12 Feb. 90, pp. 623–625) and InP/InGaAs (M. Wanless et at., 23rd IEEE Photovoltaic Specialists Conf., pp. 621–626, 1993).

A problem with tunnel diodes in solar cells is that the tunneling conductance of the diode is affected by the bandgap of the materials. Larger bandgap materials yield lower conductivities because electrons must tunnel through a larger energy barrier. In solar cell applications, it would be advantageous to make the diode of the same material as the top (larger bandgap) cell, so the diode would add minimal absorption of light passing to the lower cell. However, the larger bandgap material of the upper cell reduces diode efficiency. Making the diode of the material of the lower cell (smaller bandgap) increases its electrical efficiency, but decreases the amount of light collected by the lower cell. In addition, a prior art tunnel diode needs to be doped heavily on both sides of an abrupt junction for proper operation. During epitaxial growth of the upper cell at elevated temperatures, dopant diffusion across this junction may occur, reducing the abruptness and thus increasing the tunneling distance and degrading the tunneling characteristics. Diffusion of this type is well known in compound semiconductors, particularly for p-type dopants.

U.S. Pat. No. 4,451,691 of L. Fraas discloses a two cell device with Ge or GaAs between the layers. He also teaches a three cell device where one cell is made of $GaAs_{0.8}Sb_{0.2}$ that is sandwiched between thin $GaAs_{0.9}Sb_{0.1}$ layers for lattice matching and bandgap matching purposes. The patent notes that this three terminal cell does not require a shorting device such as the tunnel junction of two terminal cells.

SUMMARY OF THE INVENTION

It is an object of this invention to provide a tunnel junction that utilizes a thin semiconductor layer to reduce tunneling distance without increasing doping.

It is also an object of this invention to provide a unique semiconductor tunnel junction between two series connected semiconductor devices.

It is another object of this invention to provide a tandem solar cell with a tunnel junction between the cells, the junction having a thin semiconductor layer to reduce tunneling distance without increasing doping.

Additional objects, advantages, and novel features of the invention will become apparent to those skilled in the art upon examination of the following description or may be learned by practice of the invention.

To achieve the foregoing and other objects, and in accordance with the purpose of the present invention, as embodied and broadly described herein, the present invention may comprise a tunnel junction semiconductor device consisting of a first layer of p-doped first semiconductor material; a second layer of n-doped second semiconductor material; and a thin enhancement layer of third semiconductor alloy adjacent and between the first and second layers, the enhancement layer being p-doped and having a higher energy valence band than the first layer. The higher energy valence band reduces the tunneling distance across the device. Preferably, the tunnel junction is used as a shorting connection between two p-n junction devices such as light-emitting diodes or tandem solar cells in a two terminal device.

BRIEF DESCRIPTION OF THE DRAWINGS

The accompanying drawings, which are incorporated in and form part of the specification, illustrate an embodiment of the present invention and, together with the description, serve to explain the principles of the invention.

FIGS. 2a and 3a show the energy band diagrams for prior art diodes.

FIGS. 2b and 3b show the energy band diagrams for the aforementioned diodes incorporating the enhancement layer of the invention.

DETAILED DESCRIPTION OF THE INVENTION

Figure 1:
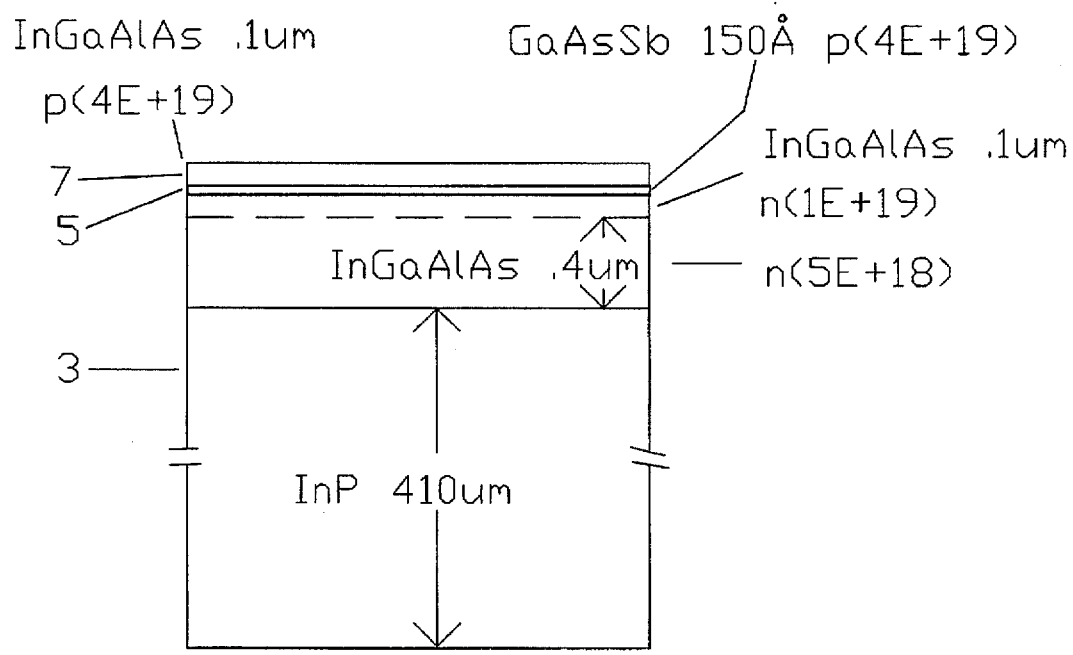
FIG. 1 shows the construction of an improved diode according to this invention.

In principle, a tunnel diode can be made of any semiconductor material if the two sides of the diode junction are doped sufficiently heavily and the junction is sufficiently abrupt to allow tunneling of electrons from one side to the other at some small forward or reverse bias voltage. For the typical homojunction tunnel diode, electrons tunnel under forward bias when there is degenerate doping (Fermi level outside the bandgap) on both sides of the junction.

The invention allows the fabrication of tunnel diodes with improved tunneling conductivity with respect to conventional homojunction diodes while not increasing doping levels nor significantly increasing light absorption; or the fabrication of diodes with reduced light absorption or reduced doping while not adversely affecting the tunneling conductivity. As shown in FIG. 1, these results are accomplished in $In_xGa_yAl_{1-x-y}As$ diodes grown on InP substrates 3 by the insertion of a thin layer 5 of GaAsSb on the p side, near the p-n junction. The GaAsSb layer 5 is doped p-type at a concentration comparable to the p-type InGaAlAs layer 7, and may have a composition of 49% GaSb/51% GaAs to be lattice-matched to the InP, or may have a higher GaSb content if its thickness is small enough to prevent the formation of misfit dislocations.

FIGS. 2a and 3a are the energy band diagrams for prior art InGaAs and InAlAs tunnel diodes, respectively. FIGS. 2b and 3b are the band diagrams for the same diodes with a 150 Å pseudomorphic p-type GaAs$_{0.35}$Sb$_{0.65}$ layer placed at the junction and doped at the same level as the p-InGaAs ($5\times10^{18}$ cm$^{-3}$) or p-InAlAs ($4\times10^{19}$ cm$^{-3}$), respectively. The minimum tunneling distance x across the junction is seen in FIG. 2(a) to be about 200 Å for the InGaAs diode and, in FIG. 3(a), about 220 Å for the InAlAs diode, without the enhancement layer of the invention. However, due to the band alignment between GaAsSb and either InGaAs or InAlAs, the minimum tunneling distance y across the junction is seen in FIGS. 2(b) and 3(b) to be reduced to about 125 Å when the GaAsSb layer is present. Since tunneling decreases exponentially with increasing tunneling distance, any reduction in the tunneling distance will significantly increase the tunneling probability and thus the tunneling current. This is clearly demonstrated by the following experimental results.

Samples were grown on (100) n$^+$-InP substrates in a Varian Gen II molecular beam epitaxial reactor as discussed in detail in J. Klem et al., *J. Cryst. Growth*, vol. 111, pp. 628–632 (1991). The epitaxial layers were nominally lattice matched to the InP substrate with the exception of the pseudomorphic GaAsSb layer. The n-type doping species was Si and p-type species was Be. Circular diodes with varied diameters were defined by a wet mesa etch down past the p/n junction. Ohmic contacts were evaporated Au/Be (p-type) and Au/Ge (n-type).

Diodes structures based on InGaAs and InAlAs were compared with and without the incorporation of the pseudomorphic GaAsSb layer. With the n-type doping concentration held constant at $1\times10^{19}$ cm$^{-3}$, the effect of reducing the p-type doping from a maximum of $4\times10^{19}$ cm$^{-3}$ down to 8 and $1.5\times10^{18}$ cm$^{-3}$ for InGaAs-based diodes, and down to $5\times10^{18}$ cm$^{-3}$ for InAlAs-based diodes was studied. DC measurement of the peak forward tunneling current density ($J_p$) and peak tunneling voltage ($V_p$) was done in the dark using common current and voltage probes. Such a two probe measurement adds a series resistance to the diode measurement that will increase the measured diode specific resistivity and the peak tunneling voltage $V_p$. Therefore, the diode resistivities reported here should be considered as an upper limit.

Table I is a summary of InGaAs/GaAsSb/InGaAs tunnel diode structures with and without a GaAsSb layer (150 Å) and with three p-type doping levels. The GaAsSb layers are doped p-type to the same level as the p$^+$-InGaAs. n=$1\times10^{19}$ cm$^{-3}$ for all diodes.

TABLE I

| ID | p$^+$-InGaAs doping (Be) cm$^{-3}$ | GaAsSb % GaSb | $J_p$ (A/cm$^2$) | $V_p/J_p$ ($\Omega$-cm$^2$) |
|---|---|---|---|---|
| A | $4\times10^{19}$ | — | 2388 | $8.4\times10^{-5}$ |
| B | $4\times10^{19}$ | 49 | 9156 | $6.8\times10^{-5}$ |
| C | $4\times10^{19}$ | 62 | 19904 | $5.0\times10^{-5}$ |
| D | $8\times10^{18}$ | 65 | 5732 | $7.7\times10^{-5}$ |
| E | a,b $1.5\times10^{18}$ | 65 | 239 | $6.3\times10^{-4}$ |
| F | $1.5\times10^{18}$ | — | c | c |
| G | $8\times10^{18}$ | — | c | c | a Also included a 1000 Å, $8\times10^{18}$ cm$^{-3}$ p-InGaAs contact layer
b Also included a 50 Å p-InGaAs ($1.5\times10^{18}$ cm$^{-3}$) spacer at the n-InGaAs interface.
c Samples were rectifying.

Table II is a summary of InAlAs/GaAsSb/InAlAs tunnel diode structures with and without the GaAsSb layer (150 Å) and with two p-type doping levels. The GaAsSb layers were doped p-type to the same level as the p$^+$-InAlAs, and n=$1\times10^{19}$ cm$^{-3}$ for all diodes.

TABLE II

| ID | p$^+$-InAlAs doping (Be) cm$^{-3}$ | GaAsSb % GaSb | $J_p$ (A/cm$^2$) | $V_p/J_p$ ($\Omega$-cm$^2$) |
|---|---|---|---|---|
| H | $4\times10^{19}$ | 65 | 139 | $1.2\times10^{-3}$ |
| I | b $5\times10^{18}$ | 65 | 3.6 | $1.4\times10^{-2}$ |
| J | $4\times10^{19}$ | — | c | c |
| K | $5\times10^{18}$ | — | c | c | a All diodes included a 500 Å p$^+$-InGaAs ($4\times10^{19}$ cm$^{-3}$) contact layer.
b Also included a 50 Å p-InAlAs ($5\times10^{18}$ cm$^{-3}$) spacer at the n-InAlAs interface.
c Samples were rectifying.

All diodes had a 40 μm diameter. The thickness of the GaAsSb layer was 150 Å. In all cases the presence of the GaAsSb-layer enhanced the forward tunneling characteristics. For example, in the most lightly doped InGaAs diode (sample E, p=$1.5\times10^{18}$ cm$^{-3}$), with the GaAsSb-layer of this invention the peak tunneling current and diode resistivity is sufficient to carry the current in an InP/InGaAs tandem solar cell at 1000 suns concentration, as discussed by M. Wanless et al., 23rd IEEE Photovoltaic Specialists Conf., pp. 621–626, 1993, and M. Wanless et al., 22nd IEEE Photovoltaic Specialists Conf, pp. 38–45, 1990, while the InGaAs-only diode (sample F) is rectifying. For the InAlAs diodes, which have the advantage of less absorption in the tunnel junction region compared to InGaAs diodes due to their higher bandgap ($E_g$=1.46 eV), the addition of the GaAsSb layer converted the diodes from rectifying to tunneling for both doping concentrations. Here again, $J_p$ on the more highly doped InAlAs/GaAsSb diode (sample H) is sufficient for the intercell interconnect of a 1000 sun InP/InGaAs tandem solar cell.

This invention has some similarity, but also significant differences, with the Ge layer used in U.S. Pat. No. 4,255,211. Both the Ge layer of the Fraas patent and the enhancement layer of this invention improve the tunneling characteristics by modification of the barrier through which the electrons must tunnel. However, while the Ge layer must be a low bandgap (0.6 eV) material, the enhancement layer of this invention is chosen based on the alignment of its valence band to the valence band of the material of the same doping type. For the invention, the significant fact is not that the bandgap of the enhancement layer of GaAsSb (0.7 eV) is larger or smaller than the bandgap of the surrounding InGaAs (~0.7 eV); it is that the valence band position of GaAsSb is higher than the valence band of the adjoining p-doped layer.

In addition, by making the enhancement layer of the same material class (III–V in the preferred embodiment) as the surrounding cell materials, the invention avoids anti-phase disorder in the crystal structure of the III–V material grown on top of a group IV material such as Ge. Also, growth of a group IV material for the device of the Fraas patent raises the likelihood of contamination (unintentional doping) of subsequent III–V layers grown in the device.

An additional advantage of the use of GaAsSb for this invention is its applicability to a wider range of cell materials than Ge, since GaAsSb alloys can be grown over a wide lattice constant range. The composition of GaAsSb is also not highly constrained by the lattice constant of the surrounding materials, since thin strained layers of GaAsSb may be grown without dislocations.

The particular sizes and equipment discussed above are cited merely to illustrate a particular embodiment of this invention. It is contemplated that the use of the invention may involve components having different sizes and shapes as long as the principle of using an enhancement layer with a valence band positioned higher than the valence band of the p-doped material, is followed. For example, different cell materials in the III-V and II-VI classes could be utilized with appropriate substrate materials. It is intended that the scope of the invention be defined by the claims appended hereto.

We claim:

1. A tunnel junction semiconductor device consisting of:

a first layer of p-doped first semiconductor material, said material being either a group III-V or group II-VI alloy;

a second layer of n-doped second semiconductor alloy; and a thin enhancement layer of p-doped third semiconductor alloy adjacent and between said first and second layers, said enhancement layer having a higher energy valence band than said first layer for reducing tunneling distance across the device;

said second layer and said enhancement layer materials being of the same class as the first layer.

2. The semiconductor device of claim 1 wherein each of said layers each consist of III-V alloys.

3. The semiconductor device of claim 2 wherein said enhancement layer is a layer of $GaAs_{1-y}Sb_y$, where $0<y\leq 1$.

4. The semiconductor device of claim 3 wherein the level of doping of said first and second alloys is too low to support tunneling current between said alloys when said enhancement layer is not present.

5. The semiconductor device of claim 3, wherein said first and second alloys are one of the group consisting of: InAlAs; InGaAs; AlGaAs; and GaAs.

6. The semiconductor device of claim 3 wherein the percentage of GaSb in said GaAsSb enhancement layer is between approximately 49 and 65%.

7. A tandem semiconductor structure having first and second semiconductor devices connected in series by a thin tunnel current enhancement layer adjacent and between said devices, a portion of said first device adjacent said enhancement layer consisting of a first layer of p-doped semiconductor alloy, and a portion of said second device adjacent said enhancement layer consisting of a second layer of n-doped semiconductor alloy, and said enhancement layer comprising a thin layer of semiconductor alloy having a different composition than each of said first and second layers, said enhancement layer being p-doped and having a higher energy valence band than said first layer for reducing tunneling distance across the first and second layers.

8. The semiconductor structure of claim 7 wherein said first and second layers each consist of first and second III-V alloys, respectively.

9. The semiconductor structure of claim 8 wherein said enhancement layer is a layer of $GaAs_{1-y}Sb_y$, where $0<y\leq 1$.

10. The semiconductor structure of claim 9 wherein the level of doping of said first and second alloys is too low to support tunneling current between said alloys when said enhancement layer is not present.

11. The semiconductor structure of claim 9 wherein the enhancement layer is at least an order of magnitude thinner than each of said first and second alloys.

12. The semiconductor structure of claim 8, wherein said first and second alloys are one of the group consisting of: InAlAs; InGaAs; AlGaAs; and GaAs.

13. The semiconductor structure of claim 12 wherein said devices are solar cells.

14. The semiconductor structure of claim 12 wherein said devices are light emitting diodes.

* * * * *